United States Patent
Wang et al.

(10) Patent No.: US 10,193,547 B2
(45) Date of Patent: Jan. 29, 2019

(54) DRIVER SYSTEM WITH AN OPTICAL POWER BASED ISOLATED POWER SUPPLY

(71) Applicant: Ohio State Innovation Foundation, Columbus, OH (US)

(72) Inventors: Jin Wang, Powell, OH (US); He Li, Columbus, OH (US); Xuan Zhang, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 0 days.

(21) Appl. No.: 15/461,554

(22) Filed: Mar. 17, 2017

(65) Prior Publication Data

US 2017/0272158 A1 Sep. 21, 2017

Related U.S. Application Data

(60) Provisional application No. 62/309,496, filed on Mar. 17, 2016.

(51) Int. Cl.

| H04B 10/12 | (2006.01) |
|---|---|
| H03K 17/567 | (2006.01) |
| H03K 17/082 | (2006.01) |
| H03K 17/16 | (2006.01) |
| H03K 17/785 | (2006.01) |
| H04B 10/69 | (2013.01) |
| H04B 10/80 | (2013.01) |

(52) U.S. Cl.
CPC ....... *H03K 17/567* (2013.01); *H03K 17/0822* (2013.01); *H03K 17/163* (2013.01); *H03K 17/785* (2013.01); *H04B 10/69* (2013.01); *H04B 10/807* (2013.01)

(58) Field of Classification Search
CPC ............ H04B 10/0799; H04B 2210/08; H04B 10/07; H04B 10/40; H04B 10/25751; H04B 10/296; H04B 10/502; H04B 10/503
USPC ......................... 398/141, 140, 171, 164, 162
See application file for complete search history.

(56) References Cited

U.S. PATENT DOCUMENTS

| 5,796,890 | A * | 8/1998 | Tsuji ..................... G08C 23/06 385/24 |
|---|---|---|---|
| 7,078,666 | B2 * | 7/2006 | Tuominen ............ H04B 10/807 136/243 |
| 8,090,267 | B2 * | 1/2012 | Uemura ............... H04B 10/801 398/140 |
| 8,180,225 | B2 * | 5/2012 | Werthen ............... H04B 10/807 398/135 |
| 9,065,326 | B2 * | 6/2015 | Hafner .................. H02M 1/092 |
| 9,887,782 | B2 * | 2/2018 | Hosking ............. H04B 10/564 |

(Continued)

*Primary Examiner* — Hibret Woldekidan
(74) *Attorney, Agent, or Firm* — Benesch, Friedlander, Coplan & Aronoff LLP

(57) ABSTRACT

The present invention relates to a driver system that can include an optical power based isolated power supply. The driver system can include an optical receiver that can be in communication with an optical transmitter to receive an optical signal. The optical receiver can be configured to convert the optical signal to a drive signal having a determined drive strength. The driver system can further include a driving circuit that can be configured to drive an input of the transistor device based on the drive signal according to a control signal defining an on-time and off-time for the driving circuit over a time interval. In some examples, the driver system can be integrated with a protection system.

20 Claims, 4 Drawing Sheets

(56) References Cited

U.S. PATENT DOCUMENTS

| | | | | |
|---|---|---|---|---|
| 9,979,491 | B2* | 5/2018 | Greene | H04L 12/40 |
| 9,997,925 | B2* | 6/2018 | Su | H02J 4/00 |
| 2011/0110005 | A1* | 5/2011 | Benner, Jr. | H01S 5/06825 |
| | | | | 361/56 |
| 2014/0023376 | A1* | 1/2014 | Walter | H04B 10/2504 |
| | | | | 398/115 |
| 2014/0267170 | A1* | 9/2014 | Mckiel, Jr. | G06F 3/0488 |
| | | | | 345/175 |
| 2015/0180328 | A1* | 6/2015 | Yao | H02H 9/025 |
| | | | | 323/284 |
| 2015/0351635 | A1* | 12/2015 | Cerussi | A61B 5/0075 |
| | | | | 600/477 |
| 2016/0269114 | A1* | 9/2016 | Beck | H04B 10/807 |
| 2016/0373186 | A1* | 12/2016 | Alshinnawi | H04B 10/07953 |
| 2017/0026116 | A1* | 1/2017 | Sprem | H04B 10/506 |

* cited by examiner

DRIVER SYSTEM WITH AN OPTICAL POWER BASED ISOLATED POWER SUPPLY

CROSS REFERENCED TO RELATED APPLICATION

This application claims the benefit of U.S. Provisional Application No. 62/309,496, filed on Mar. 17, 2016, entitled "Power Over Fiber Based Gate Drive Circuit", the contents of which are herein incorporated by reference.

TECHNICAL FIELD

This disclosure generally relates to driver systems. More specifically, this disclosure relates to a driver system with a fiber based isolated power supply.

BACKGROUND

In power electronics, driver circuits can be used to regulate current and/or voltage through components or other circuits. As an example, metal oxide field effect transistors (MOSFETs or FETs) can be used as output devices in many applications including amplifiers, power supplies, motor drivers, circuit breakers, power converters, active power filters, static synchronous compensator (STATCOM), flexible alternating current transmission system (FACTS) devices and solid-state transformers.

In general, driver circuits are composed of four major blocks, namely, a signal transfer circuit, a gate driving circuit, a protection circuit and a power circuit. To provide sufficient isolation (e.g., creepage distance) between the signal transfer circuit and the power circuit, the protection circuit can be configured with an isolation transformer that has a large magnetic core. Thus, existing driver circuits have a large footprint, are bulky and heavy. Furthermore, isolation transformers are known to have a common-mode (CM) parasitic capacitance coupling. This parasitic coupling, when introduced into the driver circuit, increases a susceptibility of the driver circuit to high common-mode dv/dt, which causes distortion in a gate drive voltage of the gate driving circuit, cross-talk between neighboring driver circuits and malfunction in upstream control circuits.

SUMMARY

In one example a driver system can include an optical receiver that can be in communication with an optical transmitter to receive an optical signal. The optical receiver can be configured to convert the optical signal to a drive signal having a determined drive strength. The driver system can further include a driving circuit that can be configured to receive a control signal and drive an input of a transistor device based on the drive signal according to the control signal. The control signal can define an on-time and off-time for the driving circuit over a time interval.

In another example, a driver system can include an optical transmitter circuit that can be configured to generate an optical signal. The driver system can further include an optical receiver circuit that can be in communication with the optical transmitter circuit. The optical receiver circuit can be configured to convert the optical signal to a gate drive signal having a determined drive strength. The driver system can further include a controller that can be configured to generate a control signal. The driver system can further include a gate drive circuit that can be configured to drive an input of a transistor device based on the gate drive signal according to the control signal. The determined drive strength can substantially match an appropriate drive strength associated with the transistor device.

DETAILED DESCRIPTION

Systems described herein can include a driver system that can be substantially free of common-mode (CM) parasitic capacitance coupling, and that can have sufficient isolation voltage between respective high-voltage and low-voltage sides of the driver system. The driver system described herein can be substantially light in weight and can have a reduced footprint in contrast to conventional driver system that employ an isolation transformer to provide the isolation voltage. The driver system can be configured with an optical power based isolated power supply that can include an optical receiver that can be configured to optically communicate with an optical transmitter positioned at a given distance from the optical receiver. Alternatively, optical power based isolated power can include in the optical transmitter.

The optical receiver can be configured to receive an optical signal with sufficient optical power from the optical transmitter, such that after the optical receiver converts the optical signal to an electrical signal, the electrical signal can have sufficient drive strength to drive a transistor device at an appropriate drive strength associated with the transistor device. Furthermore, the systems described herein can include a protection system for the driver system and/or the transistor device. The systems described herein can be integrated into an integrated circuit (IC) or can be provided as a standalone circuit element (or standalone elements) that can be mounted on a surface of a printed circuit board (PCB).

Figure 1:
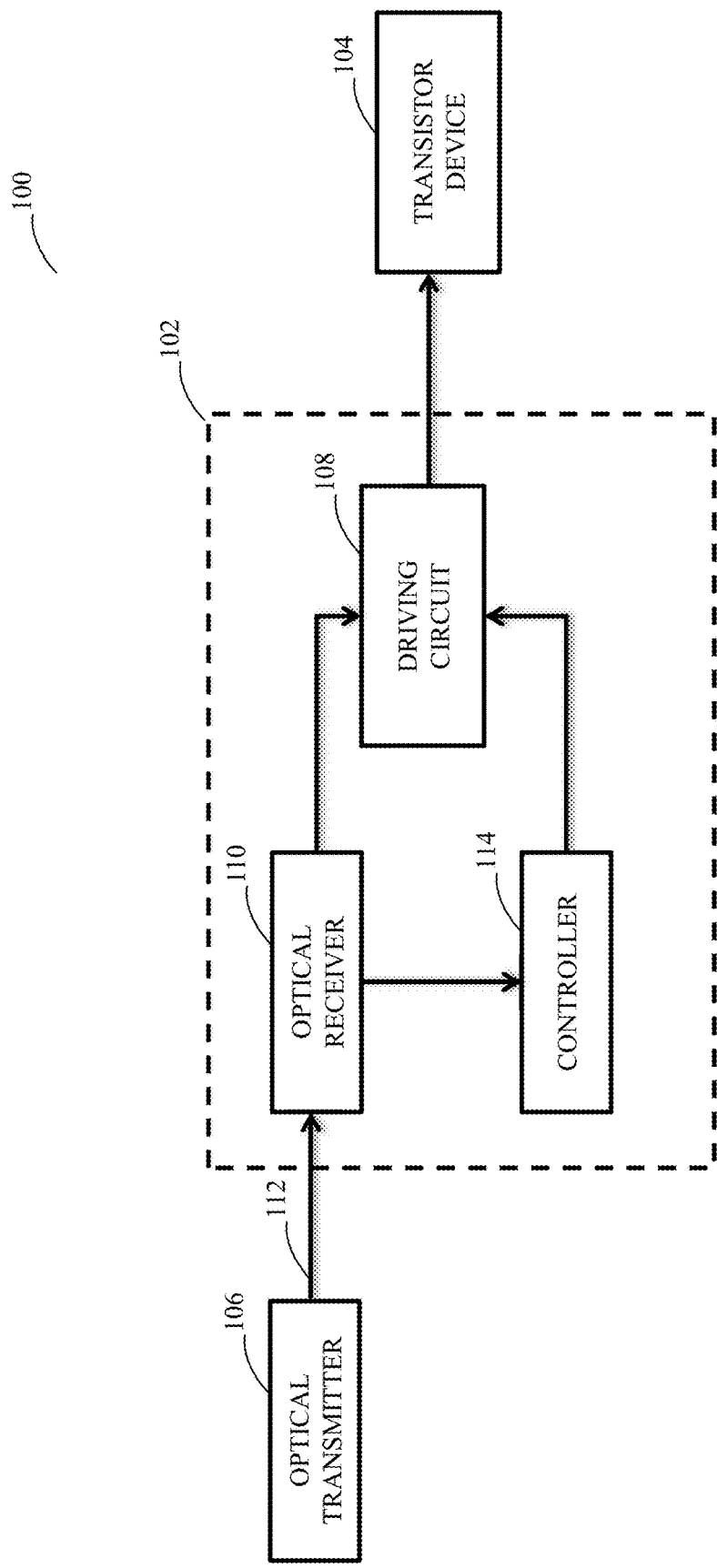
FIG. 1 depicts an example of a driver system with an optical power based isolated power supply.

Additionally or alternatively, the systems described herein can be provided as plug-in elements that can be coupled to sockets (receiving terminals) of the PCB. FIG. 1 illustrates an example of a driver system 102 with an optical power based isolated power supply that can drive a transistor device 104 at a given drive strength. The transistor device 104 can include at least one field effect transistor (FET). The at least one FET can include one of a metal oxide field effect transistor (MOSFET) and an insulated gate bipolar transistor (IGBT). The driver system 102 can be configured to apply at a gate of the transistor device 104 a drive signal that can have the given drive strength. The term "drive strength" as used herein refers to a rate that charge is being provided to the gate of the transistor device 104 over time in response to a current applied at the gate of the transistor device 104 corresponding to a rate that a gate voltage at the gate changes over time.

A capacitance exists between the gate of the transistor device 104 and a source of the transistor device 104 referred to herein as a "gate-source capacitance". The driver system 102 can be configured to generate the drive signal such that the drive strength of the drive signal substantially matches an appropriate drive strength associated with the transistor device 104. For example, driving the transistor device 104 with a drive strength substantially equal to the appropriate drive strength associated with the transistor device 104 regulates a switching speed of the transistor device 104, such that the transistor device 104 can switch within a specified switching time. Thus, the driver system 102 can be configured to deliver the drive signal to the gate of the transistor device 104 with sufficient power (e.g., electrical power) such that the gate-source capacitance charges up within a given time period to a threshold voltage, known as a gate-to-source voltage differential, and consequently, switches within the specified switching time.

The driver system 102 can be in optical communication with an optical transmitter 106. The optical transmitter 106 can be incorporated into the driver system 102 or external to the driver system 102. The optical transmitter 106 can be separated from the driver system 102 over a given distance, such that sufficient isolation voltage exists between the optical transmitter 106 and the driver system 102. The optical transmitter 106 can include a laser (not shown in FIG. 1) that can be configured to generate an optical signal at an associated wavelength having a given optical power level. The optical transmitter 106 can include an optical modulation circuit (not shown in FIG. 1) that can be configured to generate a modulated optical signal that can include an optical power signal and an optical data signal. The optical data signal can include timing information defining an on-time and an off-time for a driving circuit 108 of the driver system 102 for a given time interval. Thus, the timing information can define a switching frequency of the driver circuit 102 for the given time interval. Alternatively, the optical transmitter 106 can be configured to generate a separate optical power signal and optical data signal.

The driver system 102 can further include an optical receiver 110. The optical receiver 110 can be in optical communication with the optical transmitter 106. In one example, the optical transmitter 106 and the optical receiver 110 can be in optical communication over an optical fiber 112. The optical transmitter 106 can be configured to transmit the modulated optical signal over the optical fiber 112 to the optical receiver 110. The optical receiver 110 can include an optical demodulation circuit (not shown in FIG. 1) that can be configured to demodulate the modulated optical signal to recover the optical power signal and the optical data signal.

In an alternative example, the optical transmitter 106 and the optical receiver 110 can be in optical communication over a plurality of optical fibers 112. A given optical fiber of the plurality of optical fibers 112 can be configured to provide a first optical transmission medium and a different optical fiber of the plurality of optical fibers 112 can be configured to provide a second optical transmission medium. The optical transmitter 106 can be configured to transmit the optical power signal over the first optical transmission medium to the optical receiver 110 and the optical data signal over the second optical transmission medium to the optical receiver 110. The optical transmitter 106 can be configured to simultaneously transmit the optical power signal and the optical data signal over respective optical transmission mediums to the optical receiver 110. Alternatively, the optical transmitter 106 can be configured to transmit the optical power signal and the optical data signal at different times over respective optical transmission mediums to the optical receiver 110.

The optical receiver 110 can be configured to convert the optical power signal to an electrical power signal and transmit the electrical power signal to the driving circuit 108 for driving the gate of the transistor device 104. The optical power signal can have a given optical power level, such that after the optical power signal is converted to the electrical power signal, the electrical power signal can have sufficient gate drive strength to drive the gate of the transistor device 104.

The optical receiver 110 can be configured to convert the optical data signal to an electrical data signal. The optical receiver 110 can be configured to transmit the electrical data signal to a controller 114 of the driver system 102. The controller 114 can be configured to generate a control signal based on the electrical data signal to control the on-time and the off-time of the driving circuit 108 of the driver system 102 for the given time interval. In one example, the control signal is a pulsed-width modulated (PWM) signal. Thus, the controller 114 can be configured with PWM generator (not shown in FIG. 1). Alternatively, the controller 114 can be configured to control an external PWM generator (not shown in FIG. 1) to generate the control signal. The controller 114 can be configured to generate the PWM signal having a given duty cycle according to the timing information. The given duty cycle can define a portion of time the PWM signal is on ("active") over a period of the PWM signal. The PWM signal can be rectangular, saw-shaped, or an equivalent shaped pulsed signal.

The driving circuit 108 can be configured to output the electrical power signal to the gate of the transistor device 104 according to the control signal generated by the controller 104. The driving circuit 108 can be configured to output the electrical power signal to the gate of the transistor device 104 based on active portions of the control signal to drive the transistor device 104 with sufficient drive strength to cause the transistor device 104 to switch-on. The driving circuit 108 can be configured to discontinue outputting the electrical power signal to the gate of the transistor device 104 based on non-active portions of the control signal to switch-off the transistor device 104.

The driver system 102 can be configured to output the electrical power signal with sufficient drive strength at the gate of the transistor device 104 based on the optical power signal such that the transistor device 104 can be switched-on within the specified switching time. The driver system 102 can be configured to charge and discharge the gate-to-source capacitance at a rate that can allow the transistor device 104 to be operated substantially near an optimal switching frequency. Furthermore, control circuitry (e.g., the controller 114) and power circuitry (e.g., the optical transmitter 106) of the driver system 102 can be substantially isolated from one another since the optical transmitter 106 is located at given distance away from the driving system 102. Moreover, the driver system 102 can be substantially free of CM parasitic capacitance coupling since no isolation transformer is used in contrast to conventional driver systems. Additionally, the driver system 102 can be substantially light-weight and have a reduced footprint in contrast to conventional driver systems that use transformers.

Figure 2:
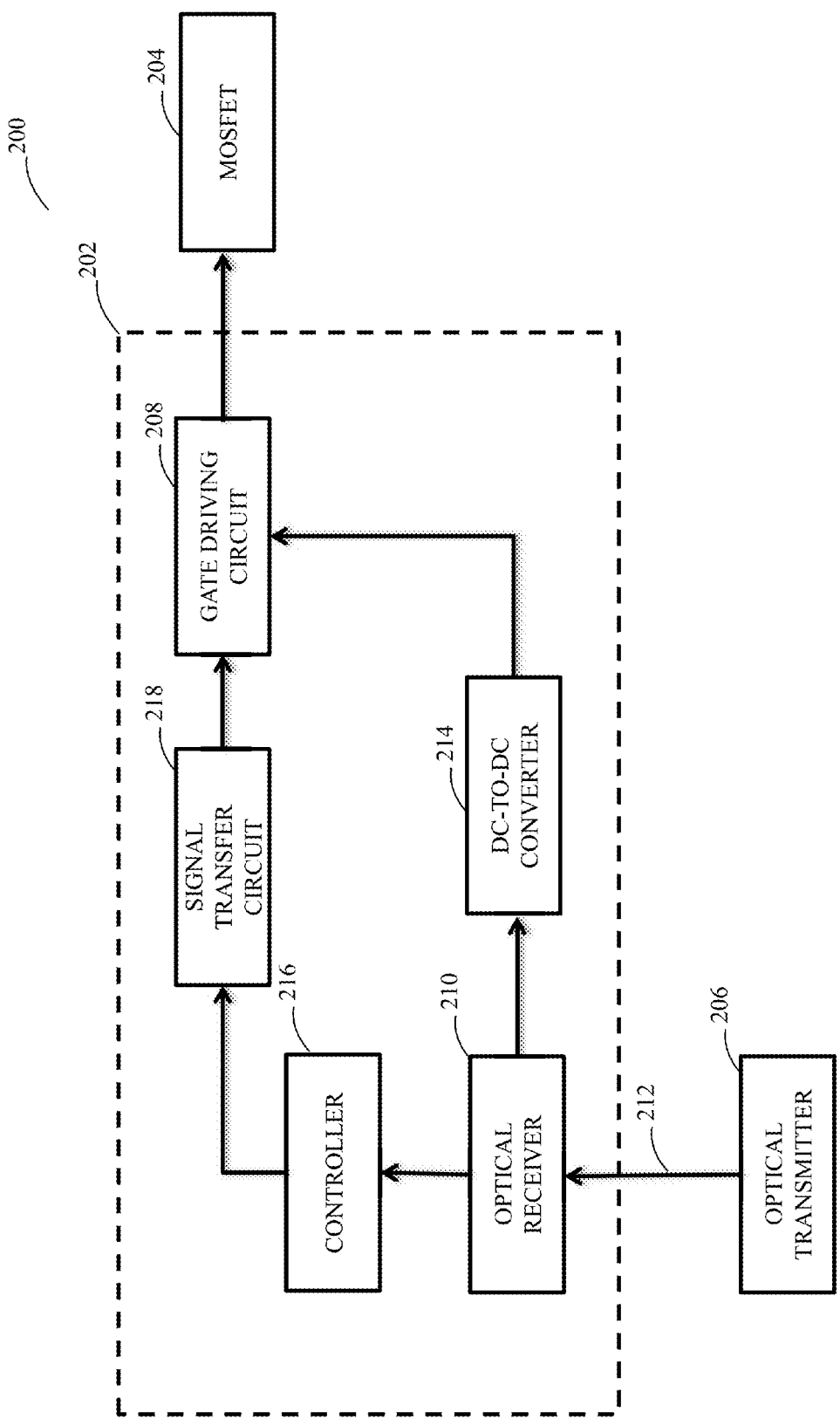
FIG. 2 depicts an example of another driver system with an optical power based isolated power supply.

FIG. 2 illustrates an example of a driver system 202 with an optical power based isolated power supply that can drive a MOSFET 204 at a given drive strength. In one example, the MOSFET 204 can correspond to a 15 kilovolt (kV) Silicon Carbide (SiC) MOSFET. The 15 kV SiC MOSFET can fabricated to switch at a given frequency. For instance, the 15 kV SiC MOSFET can be fabricated to switch at a frequency between 5-10 kiloHertz (kHz). The driver system 202 can be configured to output sufficient drive strength to drive the MOSFET 204. The driver system 202 can be configured to be in optical communication with an optical transmitter 206. In one example, the system 202 can include the optical transmitter 206. The optical transmitter 206 can include a laser (not shown in FIG. 2) that can be configured to generate optical signals at a given wavelength. The given wavelength can include, but not limited to, 915 millimeters (mm), 940 mm and 975 mm.

The optical transmitter 206 can be separated from the driver system 202 over a given distance such that sufficient isolation voltage is achieved between the optical transmitter 206 and the driver system 202. The given distance can be greater than or equal to one meter (m), such that an isolation voltage of at least 20 kilovolts (kV) can be achieved. The optical transmitter 206 can be configured to generate an optical signal that can have a given optical power level. In one example, the optical transmitter 206 can include an optical modulation circuit (not shown in FIG. 2) that can be configured to generate a modulated optical signal that can include an optical power signal and an optical data signal. The optical data signal can include timing information defining an on-time and an off-time for a gate driving circuit 208 of the driver system 202 for a given time interval. Thus, the timing information can define a switching frequency of the gate driving circuit 208. Alternatively, the optical transmitter 206 can be configured to generate separately the optical power signal and the optical data signal.

The driver system 202 can further include an optical receiver 210. In one example, the optical receiver 210 can correspond to a YCH-0.5-6V optical receiver offered by MH GoPower Co., Ltd. The YCH-0.5-6V optical receiver can have conversion efficiency at 1 Watt (W) of about 24%, and a maximum electrical output power of about 5 W. The optical receiver 210 can be configured to be in optical communication with the optical transmitter 206. The optical transmitter 206 and the optical receiver 210 can be in optical communication over an optical fiber 212. The optical transmitter 206 can be configured to transmit the modulated optical signal over the optical fiber 212 to the optical receiver 210. The optical receiver 210 can include a demodulation circuit (not shown in FIG. 2) that can be configured to demodulate the modulated optical signal to recover the optical power signal and the optical data signal.

The optical receiver 210 can be configured to convert the optical power signal to an electrical power signal and transmit the electrical power signal to a direct-current-to-direct-current (DC-to-DC) converter 214. In one example, the DC-to-DC converter 214 can correspond to a boost converter. The DC-to-DC converter 214 can be configured provide a gate power signal to the gate driving circuit 208 to drive the gate of the MOSFET 204. The optical power signal can have a given optical power level, such that after the optical power signal is converted to the electrical power signal and subsequently the electrical power signal is converted to the gate power signal by the DC-to-DC converter 214, the gate power signal can have sufficient gate drive strength for driving the gate of the MOSFET 204. Thus, the optical power signal can have sufficient optical power such that the gate power signal has sufficient gate drive strength to drive the gate of the MOSFET 204.

The optical receiver 210 can be configured to convert the optical data signal to an electrical data signal. The optical receiver 210 can transmit the electrical data signal to a controller 216 of the driver system 202. The controller 216 can be configured to generate a control signal based on the electrical data signal to control the on-time and the off-time of the gate driving circuit 208 for the given time interval. In one example, the control signal is a PWM signal. Thus, the controller 216 can be configured with PWM generator (not shown in FIG. 2). Alternatively, the controller 216 can be configured to control an external PWM generator (not shown in FIG. 2) to generate the control signal. The PWM signal can be rectangular, saw-shaped, or an equivalent shaped pulsed signal. The PWM signal can have a given duty cycle defining on-time and off-time for a period of the PWM signal. During the on-time for the period or active portion of the period, the PWM signal can have a given voltage value, and during the off-time for the period or non-active portion of the period, the PWM signal can have another voltage value. The control signal can be supplied via a signal transfer circuit 218 to the gate driving circuit 208.

The gate driving circuit 208 can be configured to output the gate power signal to the gate of the MOSFET 204 according to the control signal. The gate driving circuit 208 can be configured to output the gate power signal to the gate of the MOSFET 204 based on the active portions of the control signal to drive MOSFET 204 with sufficient drive strength to cause the MOSFET 204 to switch-on. The gate driving circuit 208 can be configured to discontinue outputting the gate power signal to the gate of the MOSFET 204 based on the non-active portions of the control signal to switch-off the MOSFET 204. The driver system 202 can be configured to output the gate power signal with sufficient drive strength at the gate of the MOSFET 204 based on the optical power signal, such that the MOSFET 204 can be switched-on within the specified switching time. Since no isolation transformer is used, the driver system 202 can be substantially free of CM parasitic capacitance coupling and can be substantially light-weight and have a reduced footprint, in contrast to conventional driver systems. Furthermore, control circuitry and/or signal transfer circuitry (e.g., the controller 114 and/or the signal transfer circuit 218) and power circuitry (e.g., the optical transmitter 206) of the driver system 202 can be substantially isolated from one another since the optical transmitter 206 is located at the given distance away from the driving system 202.

Figure 3:
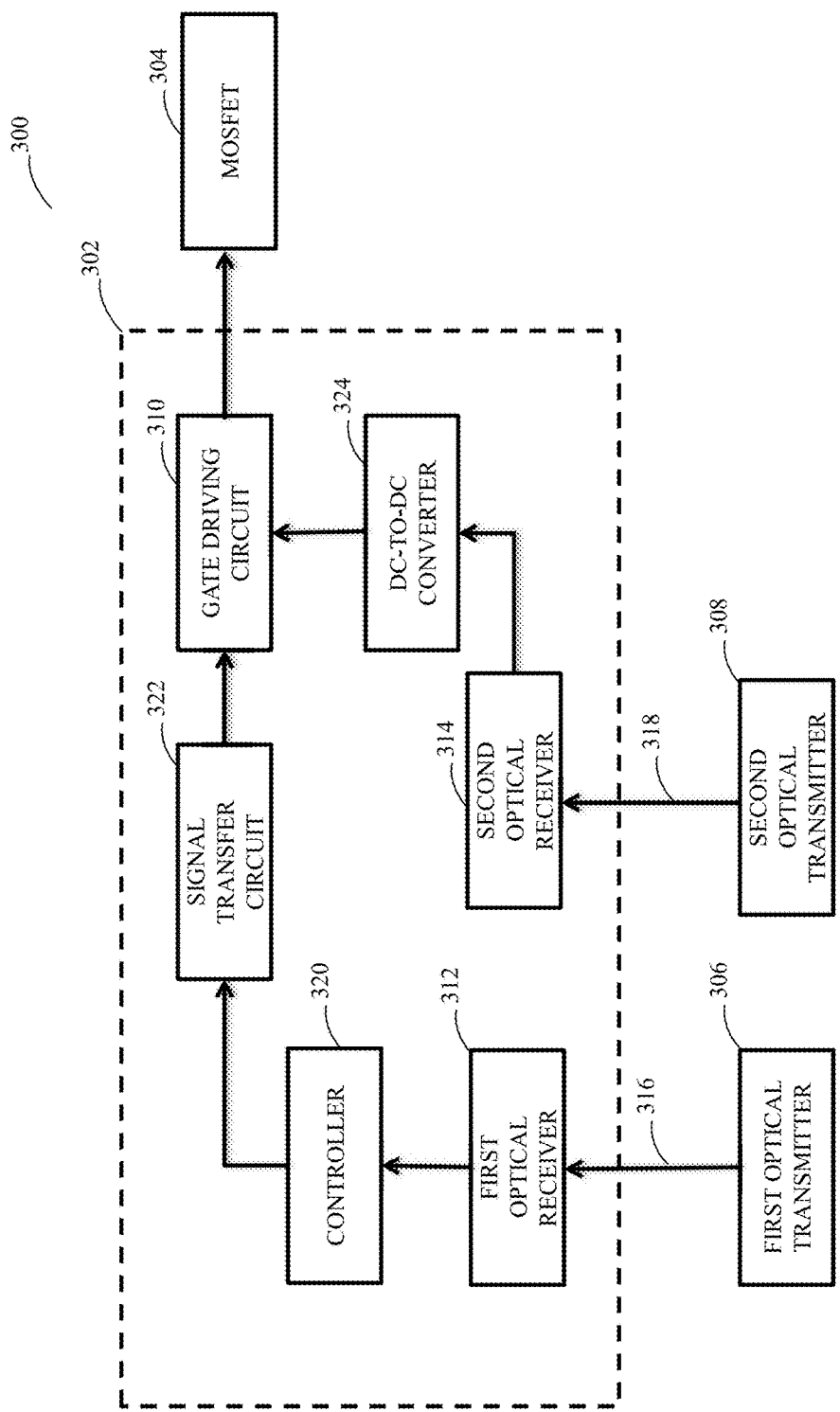
FIG. 3 depicts an example another driver system with an optical power based isolated power supply.

FIG. 3 illustrates an example of a driver system 302 with an optical power based isolated power supply that can drive a MOSFET 304 at a given drive strength. In one example, the MOSFET 304 can correspond to a 15 kV SiC MOSFET. The 15 kV SiC MOSFET can fabricated to switch at a given frequency. For instance, the 15 kV SiC MOSFET can be fabricated to switch at a frequency between 5-10 kHz. The driver system 302 can be configured to output sufficient drive strength to drive the MOSFET 204. The driver system 302 can be configured to be in optical communication with a first optical transmitter 306 and a second optical transmitter 308. In one example, the system 302 can include both the first optical transmitter 306 and the second optical transmitter 308.

The first optical transmitter 306 and the second optical transmitter 308 can include respective lasers (not shown in FIG. 3) that can be configured to generate corresponding optical signals at a given wavelength. The given wavelength can include, but not limited to, 915 millimeters (mm), 940 mm and 975 mm. In one example, the first optical transmitter 306 and the second optical transmitter 308 can be configured generate optical signals with substantially similar wavelengths. In alternative example, the first optical transmitter 306 and the second optical transmitter 308 can be configured generate optical signals with different wavelengths. In an even further example, the first optical transmitter 306 and the second optical transmitter 308 can be configured generate optical signals with different power levels and/or wavelengths.

The first optical transmitter 306 can be configured to generate an optical data signal. The optical data signal can include timing information defining an on-time and an off-time for a gate driving circuit 310 of the driver system 302 for a given time interval. Thus, the timing information can define a switching frequency of the gate driving circuit 310. The second optical transmitter 308 can be configured to generate an optical power signal. The second optical transmitter 308 can be separated from the driver system 302 over a given distance such that sufficient isolation voltage is achieved between the second optical transmitter 308 and the driver system 202. The given distance can be greater than or equal to one meter, such that an isolation voltage of at least 20 kV can be achieved. The second optical transmitter 308 can be configured to generate an optical power signal that can have a given optical power level.

The driver system 302 can further include a first optical receiver 312 and a second optical receiver 314. In one example, the second optical receiver 314 can correspond to the YCH-0.5-6V optical receiver. Additionally or alternatively, the first optical receiver 312 can correspond to the YCH-0.5-6V optical receiver or a different optical receiver. The first optical receiver 312 can be configured to be in optical communication with the first optical transmitter 306. The first optical transmitter 306 and the first optical receiver 312 can be in optical communication over a first optical transmission medium 316. The first optical transmitter 306 can be configured to transmit the optical data signal over the first optical transmission medium 316 to the first optical receiver 312. The second optical receiver 314 can be configured to be in optical communication with the second optical transmitter 308. The second optical transmitter 308 and the second optical receiver 314 can be in optical communication over a second optical transmission medium 318. The second optical transmitter 308 can be configured to transmit the optical data signal over the second optical transmission medium 318 to the second optical receiver 314.

The first optical receiver 312 can be configured to convert the optical data signal to an electrical data signal. The first optical receiver 312 can transmit the electrical data signal to a controller 320 of the driver system 302. The controller 320 can be configured to generate a control signal based on the electrical data signal to control the on-time and the off-time of the gate driving circuit 310 for the given time interval. In one example, the control signal is a PWM signal. The PWM signal can be rectangular, saw-shaped, or an equivalent shaped pulsed signal. Thus, the controller 320 can be configured with PWM generator (not shown in FIG. 3). Alternatively, the controller 320 can be configured to control an external PWM generator (not shown in FIG. 3) to generate the control signal.

The PWM signal can have a given duty cycle defining on-time and off-time for a period of the PWM signal. During the on-time for the period or active portion of the period, the PWM signal can have a given voltage value, and during the off-time for the period or non-active portion of the period, the PWM signal can have another voltage value. The control signal can be supplied via a signal transfer circuit 322 to the gate driving circuit 310.

The second optical receiver 314 can be configured to convert the optical power signal to an electrical power signal and transmit the electrical power signal to a DC-to-DC converter 324. In one example, the DC-to-DC converter 324 can correspond to a boost converter. The DC-to-DC converter 324 can be configured provide a gate power signal to the gate driving circuit 310 to drive the gate of the MOSFET 304. The optical power signal can have a given optical power level, such that after the optical power signal is converted to the electrical power signal and subsequently the electrical power signal is converted to the gate power signal by the DC-to-DC converter 324, the gate power signal can have sufficient gate drive strength for driving the gate of the MOSFET 304. Thus, the optical power signal can have sufficient optical power such that the gate power signal has sufficient gate drive strength to drive the gate of the MOSFET 304.

The gate driving circuit 310 can be configured to output the gate power signal to the gate of the MOSFET 304 according to the control signal. The gate driving circuit 310 can be configured to output the gate power signal to the gate of the MOSFET 304 based on the active portions of the control signal to drive MOSFET 304 with sufficient drive strength to cause the MOSFET 304 to switch-on. The gate driving circuit 310 can be configured to discontinue outputting the gate power signal to the gate of the MOSFET 304 based on the non-active portions of the control signal to switch-off the MOSFET 304. The driver system 302 can be configured to output the gate power signal with sufficient drive strength at the gate of the MOSFET 304 based on the optical power signal, such that the MOSFET 304 can be switched-on within the specified switching time. Since no isolation transformer is used, the driver system 302 can be substantially free of CM parasitic capacitance coupling and can be substantially light-weight and have a reduced footprint, in contrast to conventional driver systems. Furthermore, control circuitry and/or signal transfer circuitry (e.g., the controller 320 and/or the signal transfer circuit 322) and power circuitry (e.g., the second optical transmitter 308) of the driver system 302 can be substantially isolated from one another since the optical transmitter 206 is located at the given distance away from the driving system 302.

Figure 4:
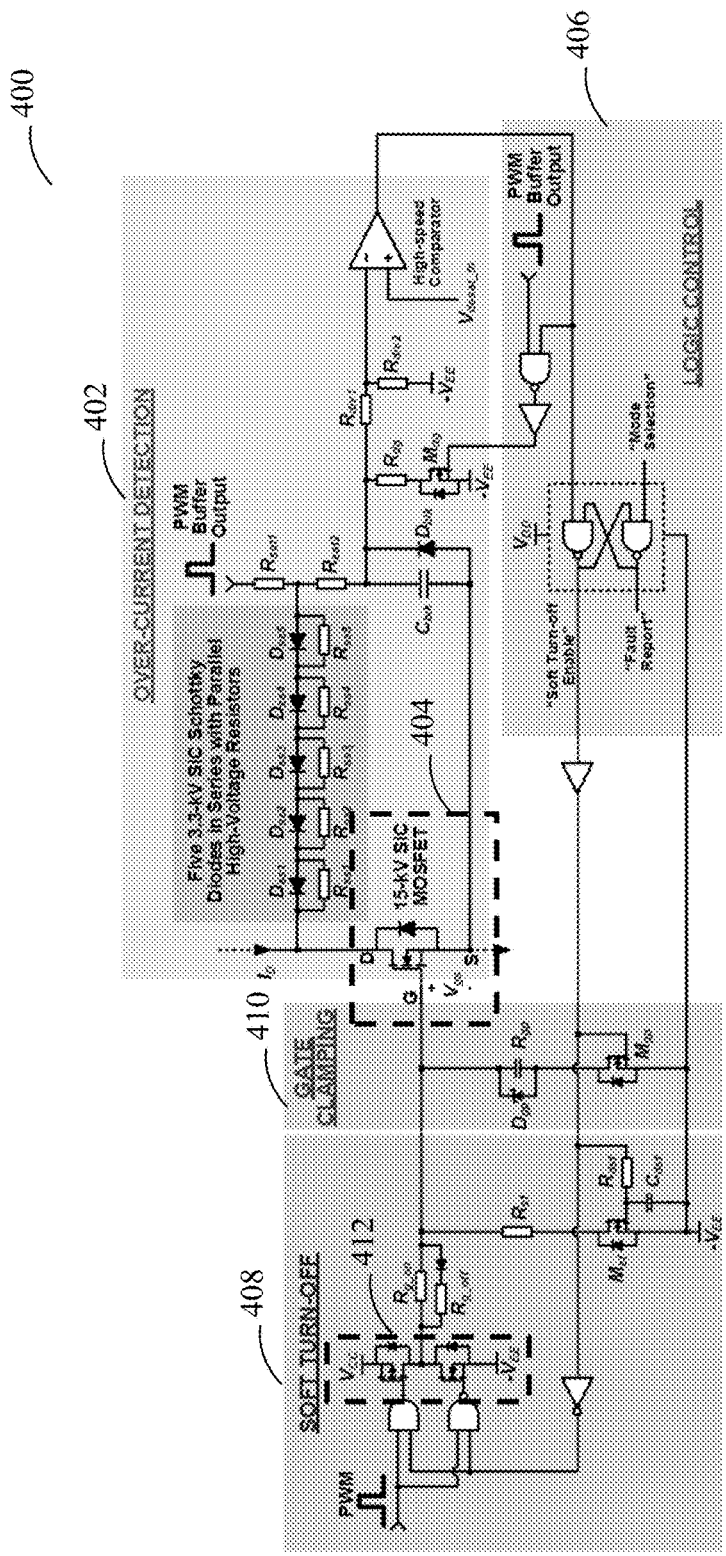
FIG. 4 depicts an example of a protection system for a transistor device that can be driven by a driver system with an optical power based isolated power supply.

FIG. 4 illustrates an example of an over-current protection system 402 that can be implemented in connection with a driver system. The over-current protection system 402 can be integrated with the driver system 102, as shown in FIG. 1, the driver system 202, as shown in FIG. 2, or the driver system 302, as shown in FIG. 3, to protect a transistor device 404 and/or the driver system from faults and/or malfunctions. Although, the transistor device 404, as shown in FIG. 4, is a 15-kV SiC MOSFET, the transistor device 404 can be any transistor device having any voltage rating and associated switching frequency. For example, the transistor device 404 can correspond to the transistor device 104, as shown in FIG. 1, the MOSFET 204, as shown in FIG. 2, or the MOSFET 304, as shown in FIG. 3. The over-current protection system 402 can be configured to detect when a maximum current of the transistor device 404 has exceeded a given value. The over-current protection system 402 does not interfere with a performance of the transistor device 404. In FIG. 4, the transistor device 404 is shown as part of the over-current protection system 402. However, the transistor device 404 can be external to the over-current protection system 402.

To sense a drain-to-source voltage drop across the transistor device 404 in an on-state and block a high drain voltage bias in the off-state, a plurality of sensing diodes can be connected in series to a drain terminal of the transistor device 404. In one example, five 3.3 kV SiC Schottky diodes ($D_{ss1}$-$D_{ss5}$, as shown in FIG. 4) can be connected in series to the drain terminal. Furthermore, a plurality of resistors ($R_{ss1}$-$R_{ss5}$, as shown in FIG. 4) can be connected in parallel with each sensing diode to provide a balanced voltage distribution. This can achieve sufficient reverse-bias blocking voltage (e.g., greater than or equal to 15 kV) and can substantially reduce an equivalent sensing diode junction capacitance. In a presence of high dv/dt at the drain terminal, lower junction capacitance of the sensing diodes can result in less displacement current flowing from the drain terminal of the transistor device 404 to sensing analog circuits, which can reduce a risk of false trigger of the protection.

The plurality of sensing diodes connected in series can cause a substantial equivalent diode forward voltage (e.g., if five sensing diodes are used, as shown in FIG. 4, an equivalent diode forward voltage five times higher can exist), which can result in a substantial offset in a sensed voltage and thus lower sensing resolution. The over-current protection system 402 can further include a comparator (e.g., a "High-speed Comparator", as shown in FIG. 4) that can achieve responses times within a sufficient specified time value to compensate for the substantial offset voltage in the sensed voltage. The over-current protection system 402 can further include a resistive voltage divider ($R_{div1}$ and $R_{div2}$, as shown in FIG. 4). The resistive voltage divider can scale the sensed voltage to match the comparator's input voltage range. Additionally, a voltage threshold reference ($VCC_{de-sat}$) of a PWM buffer output ("PWM Buffer Output", as shown in FIG. 4) can be adjusted.

In one example, the over-current protection system 402 can be triggered in an associated triode region. The over-current protection in the triode region can allow for triggering at a much lower device current, which enables a safer device operation of the transistor device 404. In another example, the over-current protection system 402 can be triggered in an associated saturation region.

A response time of the over-current protection system 402 can be a function of a blanking time delay. The blanking time delay can be required to bypass turn-on transient current of the transistor device 404 to avoid false triggering. The over-current protection system 402 can include a blanking capacitance ($C_{blk}$, as shown in FIG. 4) and oscillation damping resistor ($R_{sat1}$, as shown in FIG. 4). These two components can function to set the blanking time delay for the over-current protection system 402. Additionally or alternatively, the over-current protection system 402 can include resistor ($R_{sat2}$, as shown in FIG. 4), which can increase blanking time delay, for example, in response to the plurality of sensing diodes being reverse biased. To prevent false triggering during the transistor's device turn-off transient, an auxiliary switch ($M_{dg}$, as shown in FIG. 4) and a current limiting resistor ($R_{dg}$, as shown in FIG. 4) can be configured to discharge the blanking capacitance ($C_{blk}$, as shown in FIG. 4) after the transistor device 404 is turned-off.

Upon detecting an overcurrent condition (e.g., a fault), the over-current protection system 402 can be configured to output a detected signal to a logic control circuit 306 to initiate a soft turn-off procedure to block a gate drive signal ("$V_{cc}$", as shown in FIG. 4). In one example, the over-current protection system 402 can include the logic control circuit 406. The gate drive signal can correspond to the electrical power signal, as described in context of FIG. 1, or the gate power signal, as described in context of FIG. 2 or 3. The logic control circuit 406 can be configured to initiate the soft turn-off procedure by generating a soft turn-off signal ("Soft Turn-off Enable", as shown in FIG. 4). The soft turn-off signal can be supplied to a soft turn-off circuit 408 to softly block the gate drive signal from being supplied to gate of the transistor device 404. In one example, the over-current protection system 402 can include the soft turn-off circuit 408.

The soft turn-off signal can softly block the control signal ("PWM", as shown in FIG. 4) to block output of the gate drive signal to the gate of the transistor device 404. The gate drive signal can be softly blocked via the soft turn-off circuit 408 based on the soft turn-off signal so as to not damage a driving circuit 412 or peripheral circuits when such a fault occurs. The driving circuit 412 can correspond to the driving circuit 108, as shown in FIG. 1, the gate driving circuit 208, as shown in FIG. 2, or the gate driving circuit 310, as shown in FIG. 3. In FIG. 4, the driving circuit 412 is shown as part of the soft turn-off circuit 408. However, the driving circuit 412 can be external to the soft turn-off circuit 308. Furthermore, the logic control circuit 406 can be configured to issue a fault report command ("Fault Report", as shown in FIG. 4) in response to determining that the overcurrent condition has occurred based on a selected mode signal ("Mode Selection", as shown in FIG. 4). The selected mode signal can allow for either single or multiple faults. The fault report can be transmitted to a controller for further processing.

Additionally or alternatively, a gate clamping circuit 410 can be coupled to the transistor device 404 to protect the transistor device 404 from abruptly turning-on after being turned-off. For example, if the transistor device 404 is turned-off, a malfunction may occur, in which the transistor device 404 can be turned on again, for example, because of an increase in a gate voltage due to Miller capacitance between a collector and a base (parasitic capacitance formed between a collector and a gate) of the transistor device 404 when a collector voltage of the transistor device 404 is sharply increased. The gate damping circuit 410 can be configured to prevent such a malfunction by preventing the transistor device 404 from being turning-on after being turned-off. In one example, the over-current protection system 402 can include the gate clamping circuit 410.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims.

What is claimed is:

1. A driver system comprising:
   a plurality of optical receivers, wherein a first optical receiver of the plurality of optical receivers is configured to receive an optical power signal generated by a first optical transmitter of a plurality of optical transmitters over a first transmission medium, and wherein a second optical receiver of the plurality of optical receivers is configured to receive and an optical data signal generated by a second optical transmitter of the plurality of optical transmitters over a second transmission medium;
   wherein the first optical receiver is coupled to the first optical transmitter via a first optical fiber corresponding to the first transmission medium, and the second optical receiver is coupled to the second optical transmitter via a second optical fiber corresponding to the second transmission medium;
   wherein the first optical receiver is configured to convert the optical power signal to an electrical power signal comprising a given drive strength; and a driving circuit configured to apply the electrical power signal to an input of a transistor device to drive the transistor device at the given drive strength according to a control signal, wherein the control signal defines an on-time and an off-time for the driving circuit over a given time interval.

2. The driver system of claim 1, wherein the second optical receiver is configured to convert the optical data signal to an electrical data signal.

3. The driver system of claim 2,
wherein the electrical data signal comprises timing information characterizing the on-time and the off-time for the driving circuit over the given time interval; and
further comprising a controller configured to generate the control signal based on the electrical data signal.

4. The driver system of claim 3, wherein during the on-time, the driving circuit is configured to provide the electrical power signal to the input of the transistor device to drive the transistor device.

5. The driver system of claim 4, further comprising a direct-current-to-direct-current (DC-to-DC) converter configured to receive the electrical power signal and generate a gate power signal, wherein the driving circuit is configured to apply the gate power signal to the input of transistor device to drive the transistor device at the given drive strength according to the control signal.

6. The driver system of claim 5, wherein the DC-to-DC converter is a boost converter.

7. The driver system of claim 5, further comprising a controller configured to generate the control signal based on the electrical data signal.

8. An integrated circuit chip comprising the driver system of claim 1.

9. The driver system of claim 1, wherein the transistor comprises at least one field effect transistor (FET).

10. The driver system of claim 9, wherein the at least one FET comprises one of a metal-oxide-semiconductor FET (MOSFET) and an insulated gate bipolar transistor (IGBT).

11. The driver system of claim 9, wherein the at least one FET comprises a metal-oxide-semiconductor FET (MOSFET), the MOSFET corresponding to a Silicon Carbide (SiC) MOSFET.

12. The driver system of claim 1, wherein each of the optical power signal and the optical data signal has a given wavelength, the given wavelength corresponding to one of a 915 millimeters (mm), 940 mm and 975 mm.

13. The driver system of claim 1, wherein the plurality of optical receivers correspond to YCH-0.5-6V optical receivers.

14. The driver system of claim 1, wherein the plurality of optical receivers and the plurality of optical transmitters are separated by a given distance.

15. The driver system of claim 14, wherein the given distance is greater than or equal to 1 meter (m).

16. The driver system of claim 1, further comprising a direct-current-to-direct-current (DC-to-DC) converter configured to receive the electrical power signal and generate a gate power signal, wherein the driving circuit is configured to apply the gate power signal to the input of transistor device to drive the transistor device at the given drive strength according to the control signal.

17. The driver system of claim 16, wherein second optical receiver is configured to convert the optical data signal to an electrical data signal.

18. The driver system of claim 17, further comprising a controller configured to generate the control signal based on the electrical data signal.

19. The driver system of claim 18, wherein the electrical data signal comprises timing information characterizing the on-time and the off-time for the driving circuit over the given time interval.

20. The driver system of claim 1, further comprising the plurality of optical transmitters.

* * * * *